US012426284B2

(12) United States Patent
Lee et al.

(10) Patent No.: US 12,426,284 B2
(45) Date of Patent: Sep. 23, 2025

(54) SEMICONDUCTOR DEVICE WITH INDUCTIVE COMPONENT AND METHOD OF FORMING

(71) Applicant: Taiwan Semiconductor Manufacturing Co., Ltd., Hsinchu (TW)

(72) Inventors: Mei-Chi Lee, Tainan (TW); Chi-Cheng Chen, Tainan (TW); Wei-Li Huang, Pingtung (TW); Kai Tzeng, Neipu (TW); Chun Yi Wu, Tainan (TW); Ming-Da Cheng, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 480 days.

(21) Appl. No.: 17/828,844

(22) Filed: May 31, 2022

(65) Prior Publication Data
US 2023/0290809 A1 Sep. 14, 2023

Related U.S. Application Data

(60) Provisional application No. 63/269,133, filed on Mar. 10, 2022.

(51) Int. Cl.
H10D 1/20 (2025.01)
H01L 21/027 (2006.01)
(Continued)

(52) U.S. Cl.
CPC ........... *H10D 1/20* (2025.01); *H01L 21/0274* (2013.01); *H01L 21/50* (2013.01); *H01L 21/56* (2013.01);
(Continued)

(58) Field of Classification Search
CPC ... H01L 28/10; H01L 21/50; H01L 21/76838; H01L 21/0274; H01L 21/56;
(Continued)

(56) References Cited

U.S. PATENT DOCUMENTS 6,611,041 B2    8/2003   Maeda et al.
9,219,106 B2 *   12/2015   Lin .......................... H01L 28/10
(Continued)

FOREIGN PATENT DOCUMENTS

KR    20200045942 A    5/2020
TW    508794 B    11/2002
(Continued)

OTHER PUBLICATIONS

Wikipedia, "Photomask," https://en.wikipedia.org/w/index.php?title=Photomask&oldid=1060916535, Dec. 18, 2021, 5 pages.

*Primary Examiner* — Jasmine J Clark
(74) *Attorney, Agent, or Firm* — Slater Matsil, LLP

(57) ABSTRACT

A method of forming a semiconductor device includes: forming a passivation layer over a conductive pad that is disposed over a substrate; and forming an inductive component over the passivation layer, including: forming a first insulation layer and a first magnetic layer successively over the passivation layer; forming a first polymer layer over the first magnetic layer; forming a first conductive feature over the first polymer layer; forming a second polymer layer over the first polymer layer and the first conductive feature; patterning the second polymer layer, where after the patterning, a first sidewall of the second polymer layer includes multiple segments, where an extension of a first segment of the multiple segments intersects the second polymer layer; and after patterning the second polymer layer, forming a second insulation layer and a second magnetic layer successively over the second polymer layer.

20 Claims, 11 Drawing Sheets

(51) Int. Cl.
    *H01L 21/50*     (2006.01)
    *H01L 21/56*     (2006.01)
    *H01L 21/768*     (2006.01)
    *H01L 23/31*     (2006.01)
    *H01L 23/528*     (2006.01)
    *H01L 23/64*     (2006.01)

(52) U.S. Cl.
    CPC .. *H01L 21/76801* (2013.01); *H01L 21/76838* (2013.01); *H01L 23/3171* (2013.01); *H01L 23/5283* (2013.01); *H01L 23/645* (2013.01)

(58) Field of Classification Search
    CPC ............ H01L 21/76801; H01L 23/645; H01L 23/3171; H01L 23/5283
    USPC ....................................................... 257/531
    See application file for complete search history.

(56) References Cited

U.S. PATENT DOCUMENTS

| | | | |
|---|---|---|---|
| 10,263,064 B2 | 4/2019 | Ku et al. | |
| 11,037,885 B2 | 6/2021 | Chien et al. | |
| 11,532,692 B2 * | 12/2022 | Tzeng | H01L 23/3192 |
| 2014/0291789 A1 | 10/2014 | Zeng | |
| 2020/0127078 A1 | 4/2020 | Tzeng et al. | |
| 2022/0013457 A1 | 1/2022 | Iida et al. | |

FOREIGN PATENT DOCUMENTS

| | | |
|---|---|---|
| TW | 201906176 A | 2/2019 |
| TW | 202107664 A | 2/2021 |

\* cited by examiner

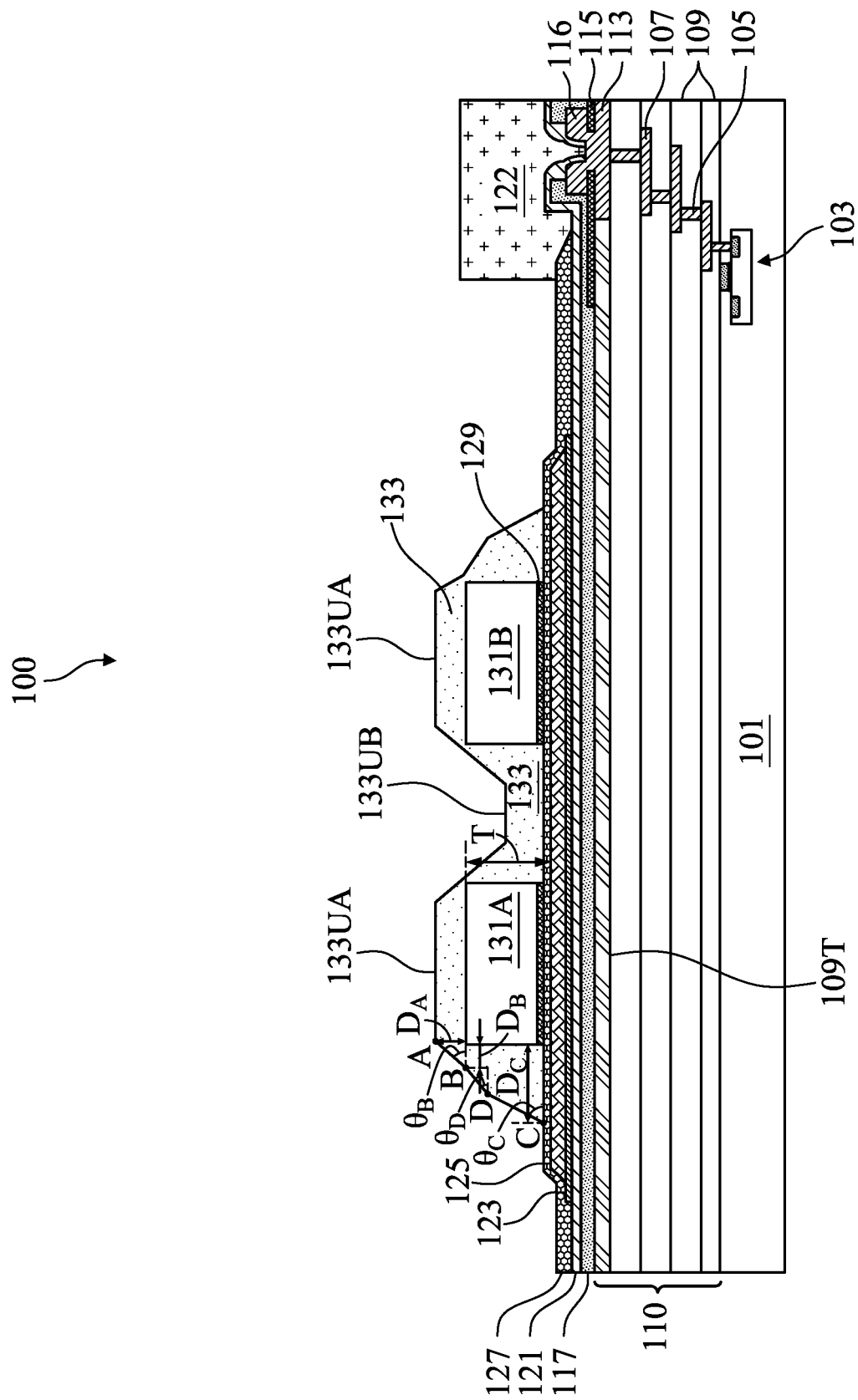

SEMICONDUCTOR DEVICE WITH INDUCTIVE COMPONENT AND METHOD OF FORMING

PRIORITY CLAIM AND CROSS-REFERENCE

This application claims the benefit of U.S. Provisional Application No. 63/269,133, filed on Mar. 10, 2022, entitled "Polyimide Kink Profile on Cu Trace, and Critical Enclosure/Film Thickness", which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. As the integration density increases, challenges arise in the manufacturing of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-6, and 7A-7C illustrate various views of a semiconductor device at various stages of manufacturing, in accordance with an embodiment.

DETAILED DESCRIPTION

Figure 1:
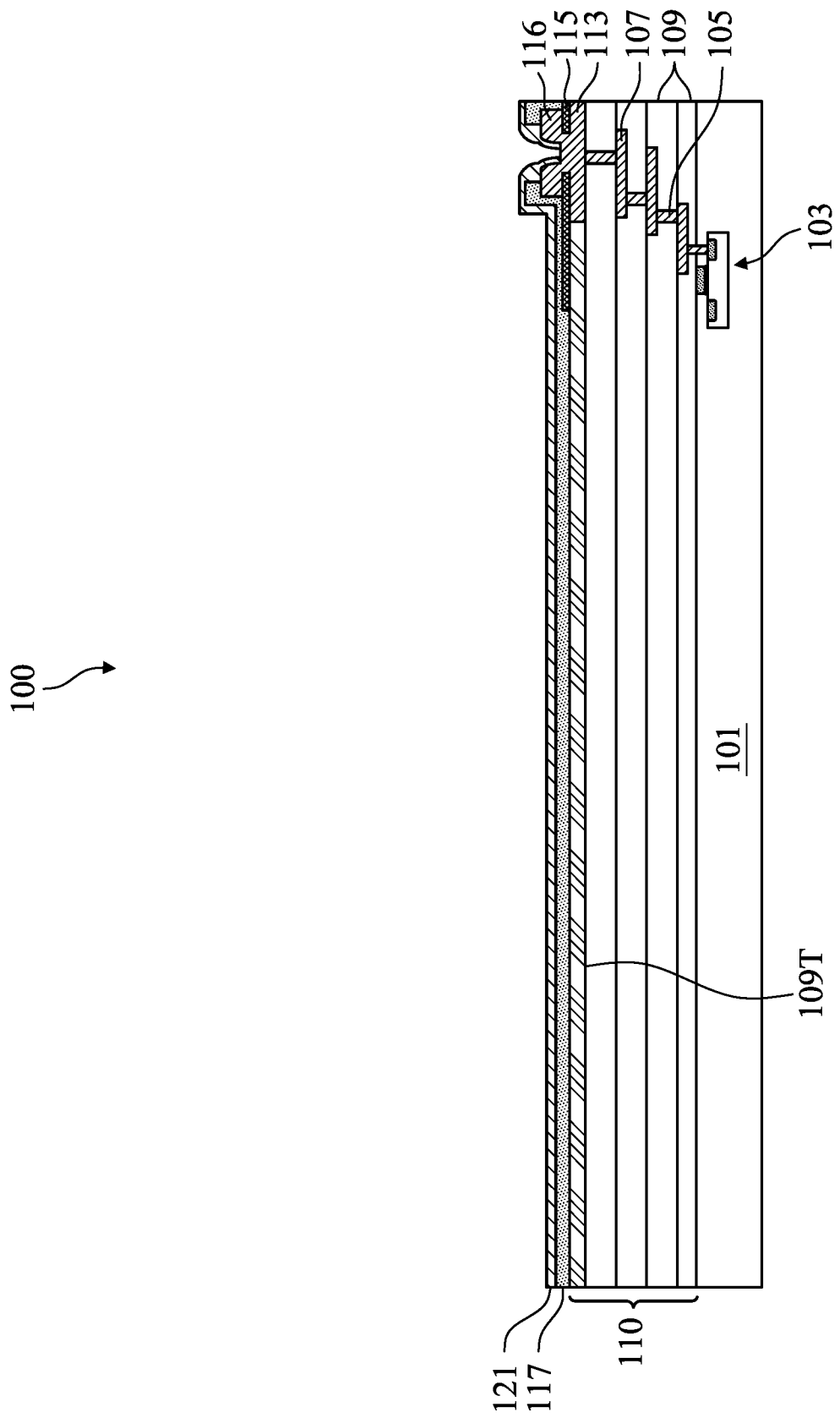

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description herein, unless otherwise specified, the same or similar reference numerals in different figures refer to the same or similar element formed by a same or similar formation method using a same or similar material(s).

In some embodiments, an inductive component is formed over a passivation layer of a semiconductor die. The inductive component includes: a first insulation layer and a first magnetic film formed successively over the passivation layer, a first polymer layer over the first magnetic film, conductive features (e.g., coils) formed over the first polymer layer, a second polymer layer over the first polymer layer around the conductive features, and a second insulation layer and a second magnetic film formed successively over the second polymer layer. The second polymer layer is formed by a double exposure process using two different mask layers, such that a sidewall of the second polymer layer, after the double exposure process, has a concave shape. The shape and dimensions of the second polymer layer are tunable by adjusting the mask layers of the double exposure process, which allows the electrical properties of the inductive component to be adjusted to achieve desired values in a target range.

FIGS. 1-6, and 7A-7C illustrate various views (e.g., cross-sectional view, plan view) of a semiconductor device 100 at various stages of manufacturing, in accordance with an embodiment. The semiconductor device 100 includes inductive components (see, e.g., 150 in FIG. 7A) formed in a back-end-of-line (BEOL) process over passivation layer(s) of a semiconductor die. Note that for simplicity, not all features of the semiconductor device 100 are illustrated, and FIGS. 1-6, and 7A-7C may illustrate only a portion of the semiconductor device 100.

FIG. 1 illustrates the semiconductor device 100 in an intermediate stage of manufacturing. The semiconductor device 100 in FIG. 1 is or includes a semiconductor die (also referred to as a die, or an integrated-circuit (IC) die). As illustrated in FIG. 1, the semiconductor device 100 includes a substrate 101, electrical components 103 formed in/on the substrate 101, an interconnect structure 110 over the substrate 101, a contact pad 116, a first passivation layer 115, a second passivation layer 117, and a polymer layer 121.

The substrate 101 may be a semiconductor substrate, such as silicon, doped or undoped, or an active layer of a semiconductor-on-insulator (SOI) substrate. The semiconductor substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Electrical components 103, such as transistors, diodes, capacitors, resistors, or the like, may be formed in and/or on the semiconductor substrate 101 and may be interconnected by the interconnect structures 110 to form functional circuits of the semiconductor die. The electrical components 103 may be formed using any suitable methods. The interconnect structure 110 includes dielectric layers 109 over the semiconductor substrate 101 and conductive features (e.g., vias 105 and conductive lines 107) formed in the dielectric layers 109. The dielectric layers 109 may be formed of a dielectric material (e.g., a low-k dielectric material) using a suitable formation method, such as chemical vapor deposition (CVD), physical vapor deposition (PVD), combinations thereof, or the like. The conductive features may be formed of a conductive material (e.g., copper) using a suitable formation method, such as deposition, damascene, dual damascene, or the like. FIG. 1 illustrates a top dielectric layer 109T (e.g., the topmost dielectric layer) of the interconnect structure 110, and a metallization pattern 113 (e.g., a copper pad) in the top dielectric layer 109T.

Still referring to FIG. 1, the first passivation layer 115 is formed over the topmost dielectric layer 109T. The first passivation layer 115 may be formed of one or more suitable dielectric materials such as silicon oxide, silicon nitride, low-k dielectrics such as carbon doped oxides, extremely low-k dielectrics such as porous carbon doped silicon dioxide, a polymer such as polyimide, polybenzoxazole (PBO), benzocyclobutene (BCB), combination thereof, or the like. The first passivation layer 115 may be formed through a process such as CVD, although any suitable process may be utilized.

Next, the first passivation layer 115 is patterned, e.g., using photolithography and etching processes. An opening is formed in the first passivation layer 115, and a contact pad 116 (also referred to as a conductive pad) is formed to extend through the opening to be coupled to the metallization pattern 113. Throughout the discussion herein, unless otherwise specified, words such as "coupled" and "coupling" refer to electrical coupling, the word "conductive" means electrically conductive, and words such as "insulation" or "insulator" refer to electrical insulation/insulator.

The contact pad 116 is formed over and in electrical contact with the metallization pattern 113 in order to provide electrical connection to the functional circuits of the die. The contact pad 116 may comprise aluminum, copper, nickel, the like, or a combination thereof. The contact pad 116 may be formed using a deposition process, such as sputtering, to form a layer of conductive material. Next, portions of the layer of conductive material may be removed through a suitable process, such as photolithography and etching, to form the contact pad 116. However, any other suitable process may be utilized to form the contact pad 116.

The second passivation layer 117 may be formed over the contact pad 116 and the first passivation layer 115. The second passivation layer 117 may be formed of a same or similar material as the first passivation layer 115, although a different material may also be used.

After the second passivation layer 117 is formed, another opening through the second passivation layer 117 is formed to expose at least a portion of the underlying contact pad 116. Next, the polymer layer 121 is formed over the contact pad 116 and the second passivation layer 117. In an embodiment, the polymer layer 121 is formed of a polyimide (PI) material. Next, an opening is formed through the polymer layer 121 to expose the underlying contact pad 116, in order to allow for physical and electrical contact between the contact pad 116 and a subsequently formed post-passivation interconnect (PPI) structure 122 (see, e.g., FIG. 2).

Figure 2:
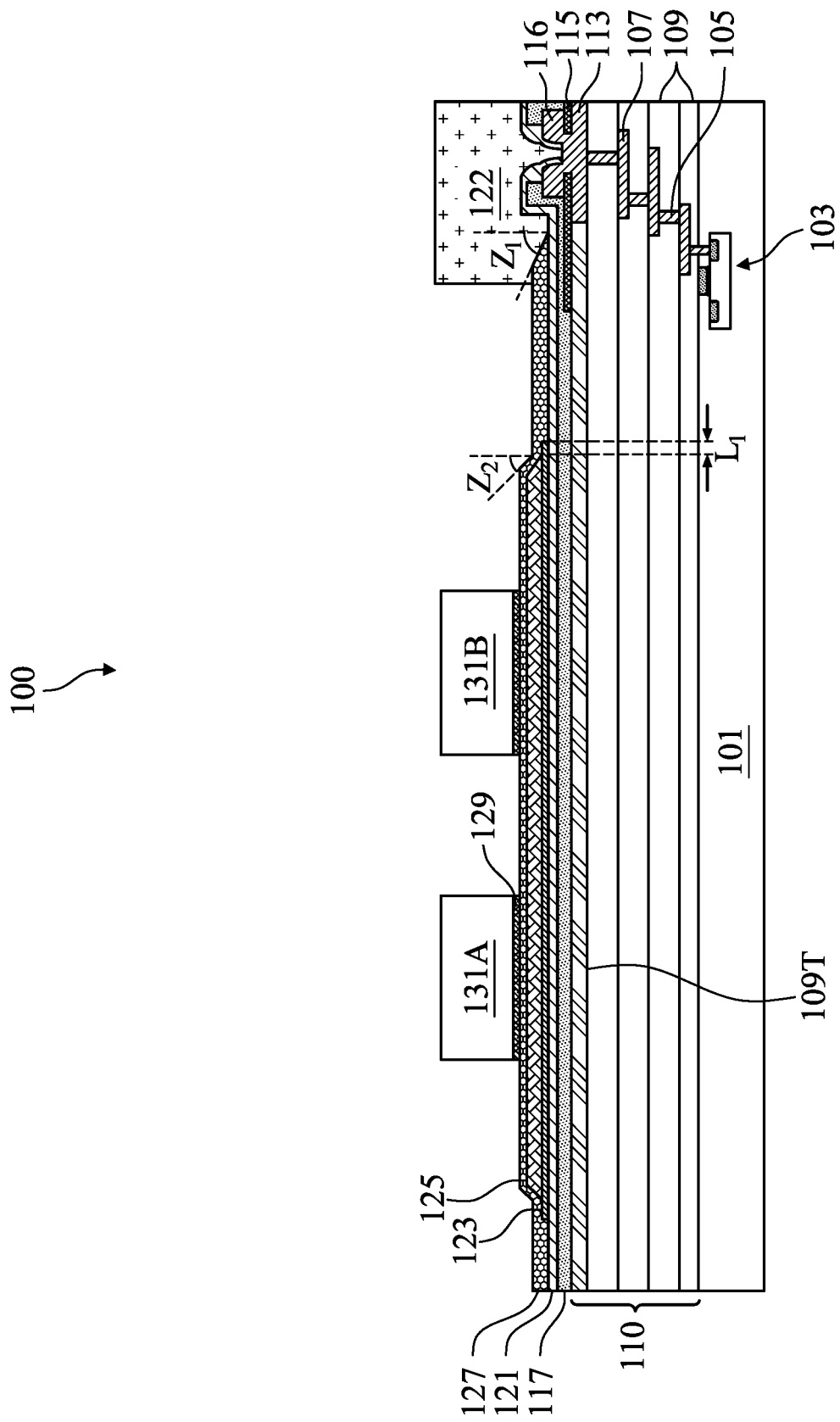

Next, in FIG. 2, an insulation layer 123 is formed over the polymer layer 121. The insulation layer 123 may be formed of a dielectric material, such as silicon nitride, silicon oxide, or the like, using a suitable formation method, such as PVD, CVD, atomic layer deposition (ALD), or the like. Next, a magnetic film 125 is formed over the insulation layer 123. In some embodiments, the magnetic film 125 is formed of a magnetic material, such as a magnetic compound material.

An example of the magnetic compound material is cobalt zirconium tantalum (CoZrTa). Besides CoZrTa, other magnetic material, such as iron (Fe) compound, nickel (Ni) compound, or the like, may also be used to form the magnetic film 125.

Next, an etching process is performed to pattern the deposited magnetic film 125. For example, an photoresist layer is formed over the magnetic film 125 and patterned, and the patterned photoresist layer is used as an etching mask to pattern the magnetic film 125 in a suitable etching process (e.g., a wet etch process). Notably, the etching process forms slanted sidewalls for the magnetic film 125. The insulation layer 123 may act as an etch stop layer during the etching of the magnetic film 125, and may prevent damage to underlying layers/structures. In some embodiments, the patterned photoresist layer used for patterning the magnetic film 125 is then removed by a suitable process (e.g., ashing).

Next, an etching process is performed to pattern the insulation layer 123. For example, a patterned photoresist layer is formed over the insulation layer 123 and over the patterned magnetic film 125, and is used as an etching mask to pattern the insulation layer 123 in a suitable etching process (e.g., an anisotropic etching process). After the patterning of the insulation layer 123, portions of the insulation layer 123/magnetic film 125 disposed in the region of the inductive component 150 (see, e.g., FIG. 7A) remain, and other portions of the insulation layer 123/magnetic film 125 (e.g., disposed outside the region of the inductive component 150) are removed. The patterned photoresist layer is then removed by a suitable process (e.g., ashing).

In some embodiments, the etching mask (e.g., patterned photoresist layer) used in the etching process to pattern the insulation layer 123 is designed to generate a lateral offset L1 (may also be referred to as a lateral distance) between sidewalls of the magnetic film 125 and respective sidewalls of the underlying insulation layer 123. In other words, the sidewalls of the magnetic film 125 are recessed from respective sidewalls of the insulation layer 123. The lateral offset L1 may be, e.g., smaller than about 0.5 μm (e.g., 0<L1<0.5 μm). Note that the sidewalls of the magnetic film 125 are shaped to be slanted (e.g., having a slanted linear profile). The shaping of the sidewall of the magnetic film 125 may be achieved by an etching process (e.g., a wet etch process).

The slanted sidewall profile of the magnetic film 125 help to form an angle $Z_2$ between the slanted upper surface of the subsequently formed polymer layer 127 and the vertical direction of FIG. 2 (e.g. a direction perpendicular to the upper surface of the substrate 101). Note that in FIG. 2, due to the slanted sidewall of the magnetic film 125, the lateral distance $L_1$ is measured between the sidewall of the insulation layer 123 (e.g., a straight sidewall perpendicular to the upper surface of the substrate 101) and a closest point (e.g., a lowest point) of the slanted sidewall of the magnetic film 125. The lateral offset $L_1$ may help to reduce cracking of the underlying layers, because the magnetic film 125 may exert a tensile stress, and the insulation layer 123 serves as a stress buffer for the magnetic film 125. Without the lateral offset $L_1$, sidewalls of the magnetic film 125 would be aligned with the sidewalls of the insulation layer 123, and the stress of the magnetic film 125 would extend downward into, e.g., the polymer layer 121 and may cause cracking of the polymer layer 121.

Next, a polymer layer 127 is formed over the magnetic film 125, the insulation layer 123, and the polymer layer 121. In some embodiments, the polymer layer 127 is formed of a polyimide (PI) material, such as a photosensitive PI material by a suitable deposition method. Next, the polymer layer 127 is patterned, e.g., by a photolithography process. For example, a mask layer with patterns is positioned over the polymer layer 127, and a light source is projected on the polymer layer 127 through the mask layer. The patterns of the mask layer allow light to pass through the mask layer and reach certain portion of the polymer layer 127, and block the light from reaching other portions of the polymer layer 127. After being exposed to the light source, the photosensitive polymer layer 127 is developed by using a developer (e.g., a chemical), which removes exposed or unexposed portions of the polymer layer 127, depending on whether the polymer layer 127 is a negative or positive type of photosensitive material.

Notably in FIG. 2, the sidewall of a first portion of the polymer layer 127 proximate to the contact pad 116 has a slanted sidewall. In particular, the slanted sidewall of the first portion of the polymer layer 127 forms an angle $Z_1$ with the vertical direction of FIG. 2. The angle $Z_1$ may be formed by adjusting the exposure energy of the photolithography process and/or by adjusting the focus (e.g., moving the focus up or down) of the photolithography process. For example, by adjusting the focus of the photolithography process to be below the upper surface of the polymer layer 127 (e.g., between the upper surface and the lower surface of the first portion of the polymer layer 127), a slanted sidewall (instead of a vertical sidewall) may be achieved, and the angle $Z_1$ is adjustable by adjusting the focus and/or the exposure energy. In an example embodiment, the angle $Z_1$ is between about 15 degrees and about 75 degrees. In addition, an angle $Z_2$ is formed between the slanted upper surface of a second portion of the polymer layer 127 and the vertical direction of FIG. 2, where the second portion of the polymer layer 127 extends along the slanted sidewalls of the magnetic film 125. The angle $Z_2$ may be influenced by the slanted sidewall of the underlying magnetic film 125, and may be adjusted by adjusting the focus and/or the exposure energy of the photolithography process used to pattern the polymer layer 127. In some embodiments, the angle $Z_2$ is between about 35 degrees and about 75 degrees.

Still referring to FIG. 2, a post-passivation interconnect (PPI) structure 122 is formed over and electrically coupled to the contact pad 116. The PPI structure 122 may include a conductive line (e.g., copper line) extending parallel to the upper surface of the substrate 101 for re-routing the electrical connection to the contact pad 116 to a different location, and may include PPI pads (e.g., copper pads) for forming conductive connector (e.g., copper pillars) thereon. For simplicity, FIG. 2 shows an example where the PPI structure 122 is a PPI pad formed directly over the contact pad 116. In some embodiments, to form the PPI structure 122, a photoresist layer is formed over the polymer layers 121/127 and over the contact pad 116. The photoresist layer is then patterned to form an opening over the contact pad 116. A conductive material, e.g., copper, is then formed in the opening to form the PPI structure 122. The photoresist layer is then removed after the PPI structure is formed.

In some embodiments, the angle $Z_1$ between the slanted sidewall of the polymer layer 127 and the vertical direction of FIG. 2 reduces or prevents the "PPI photoresist bubble issue," which occurs when the angle $Z_1$ is too small (e.g., smaller than 15 degrees). With small angle $Z_1$, air bubbles may be trapped between the polymer layer 127 and the photoresist layer, when the photoresist layer is deposited over the polymer layer 127. The air bubbles may further expand during subsequent thermal process(es) (e.g., baking of the photoresist layer). When the conductive material (e.g., copper) is formed to fill the opening in the photoresist layer, the conductive material may fill the bubble areas, which may result in the PPI structure 122 having un-predictable shape/size different from the designed shape/size, and may cause electrical short (e.g., bridging) between the PPI structure 122 and adjacent conductive features. A larger angle $Z_1$ (e.g., larger than about 15 degrees) as disclosed herein prevents or reduces the occurrence of the PPI photoresist bubble issue, thereby improving device reliability and production yield. Due to process limitations, the upper limit achievable for the angle $Z_1$ is about 75 degrees, in some embodiments.

FIG. 2 further illustrates a first conductive feature 131A and a second conductive feature 131B, which may be collectively referred to as conductive features 131. The conductive features 131 are formed over the polymer layer 127 and over (e.g., directly over) the magnetic film 125 in the region of the inductive component. The conductive features 131 may be formed in the same processing step for forming the PPI structure 122 (therefor may also be considered as PPI structures), or may be formed by another formation process similar to that for forming the PPI structure 122. The first conductive feature 131A and the second conductive feature 131B may be conductive patterns (e.g., parallel conductive lines) and may be used to form an inductive component. In some embodiments, the conductive features 131 includes a seed layer 129. The seed layer 129 may be formed of copper or copper alloys. However, other metals, such as nickel, palladium, silver, gold, aluminum, combinations thereof, and multi-layers thereof, may also be used.

Figure 3:
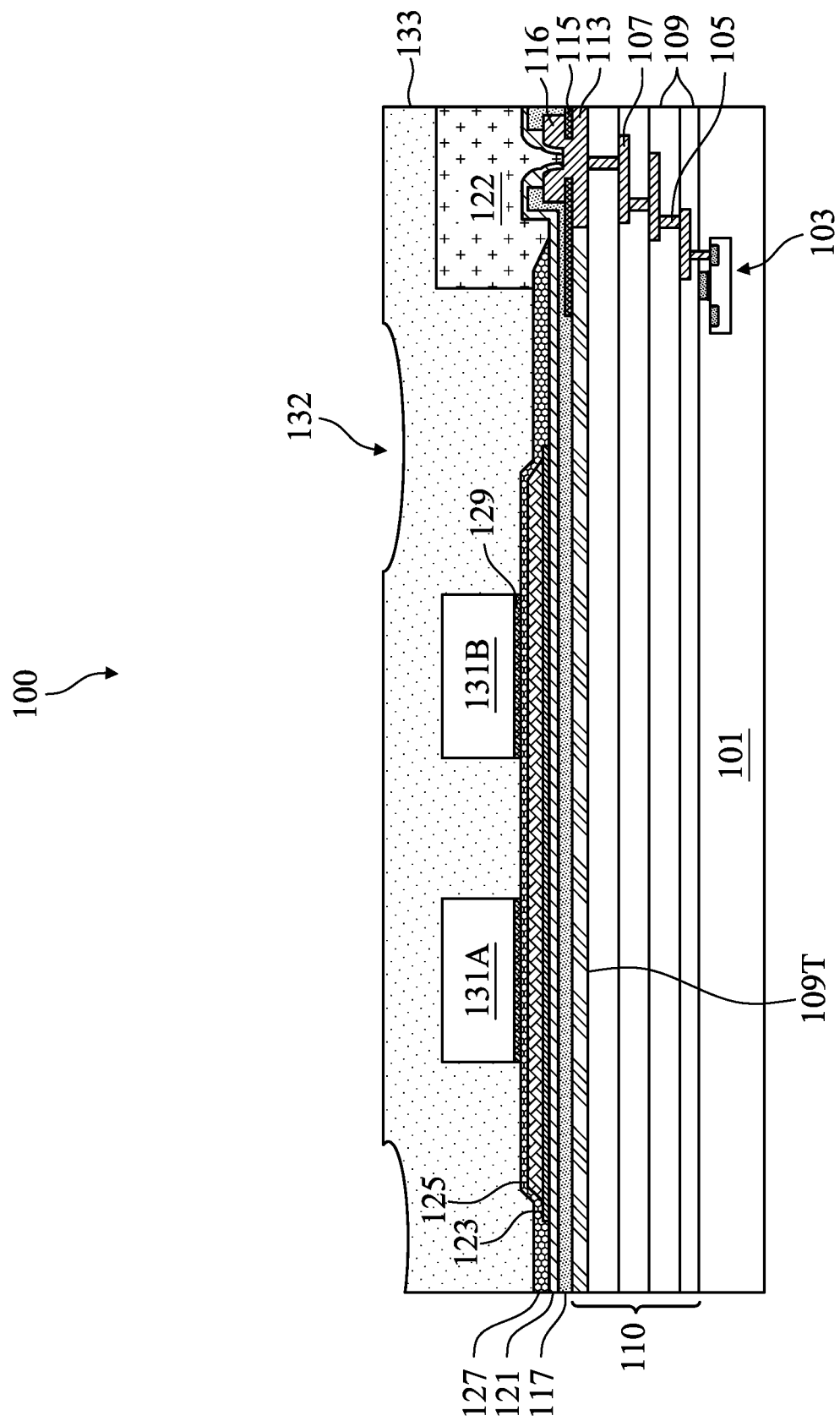

Next, in FIG. 3, a polymer layer 133 is formed over the polymer layer 127, the conductive features 131, and the PPI structure 122. In the example embodiment, the polymer layer 133 is formed of a photosensitive polyimide material, such as PBO or BL-300 material, and may be formed by a suitable method, such as spin coating. The thickness of the as-deposited polymer layer 133 may be between about 18 μm and about 23 μm, as an example. FIG. 3 further illustrates recesses 132 at the upper surfaces of the polymer layer 133, which are formed due to differences in the pattern density (e.g., density of the conductive features 131 or the PPI structure 122) in different areas of the semiconductor device 100.

Figure 4:
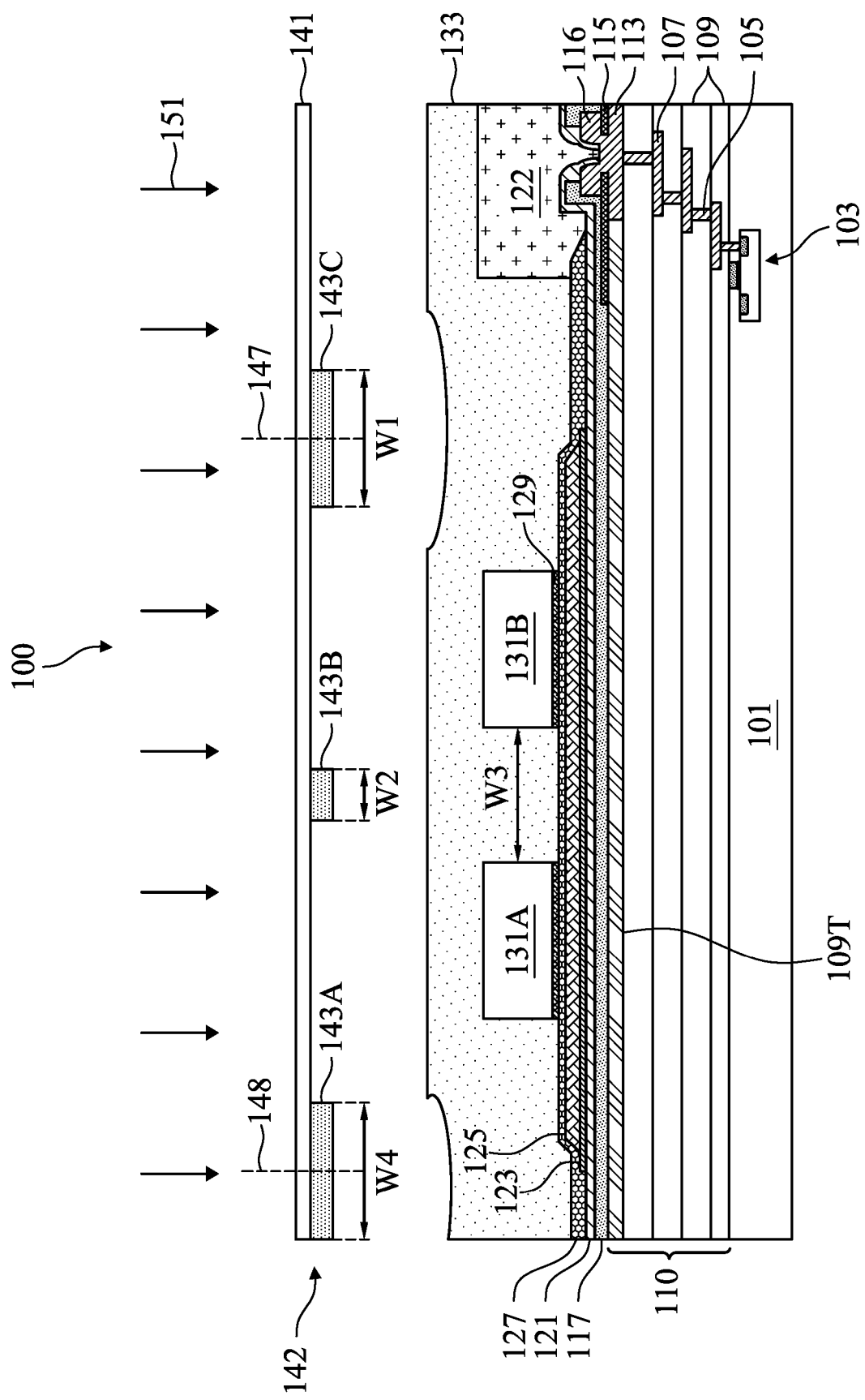

Next, in FIG. 4, a light source 151 is projected onto the polymer layer 133 through a mask layer 142. The mask layer 142 includes a transparent layer 141 (e.g., a glass layer, or a quartz layer) and non-transparent patterns 143A, 143B, and 143C attached to the transparent layer 141. The non-transparent patterns 143A, 143B, and 143C are formed of a material(s) that is non-transparent to the light source 151, which light source 151 includes lights having one or more wavelengths. The non-transparent patterns 143A, 143B, and 143C may be collectively referred to as non-transparent patterns or light-blocking patterns. The processing of FIG. 4 may also be referred to as a first exposure process for the polymer layer 133.

In the example of FIG. 4, the non-transparent patterns 143 are formed at certain locations of the mask layer 142 such that during the first exposure process for the polymer layer 133, the non-transparent patterns 143A is over and at the left side of the conductive feature 131A, the non-transparent pattern 143B is over and between the conductive features 131, and the non-transparent patterns 143C is over and at the right side of the conductive feature 131B. In the illustrated embodiment, the non-transparent patterns 143B has a width W2, which is smaller than a distance W3 measured between the conductive features 131 by, e.g., about 20 μm to about 30

μm. The non-transparent pattern 143C has a width W1 and a center axis 147. The non-transparent pattern 143A has a width W4 and a center axis 148. In some embodiments, the light source 151 is a mixture of G light (e.g., light having wavelength between 430 nm and 440 nm), H light (e.g., light having wavelength between 400 nm and 410 nm), and I light (e.g., light having wavelength between 360 nm and 370 nm). The exposure energy of the first exposure process may be between about 500 millijoule (mj) and about 800 mj.

Figure 5:
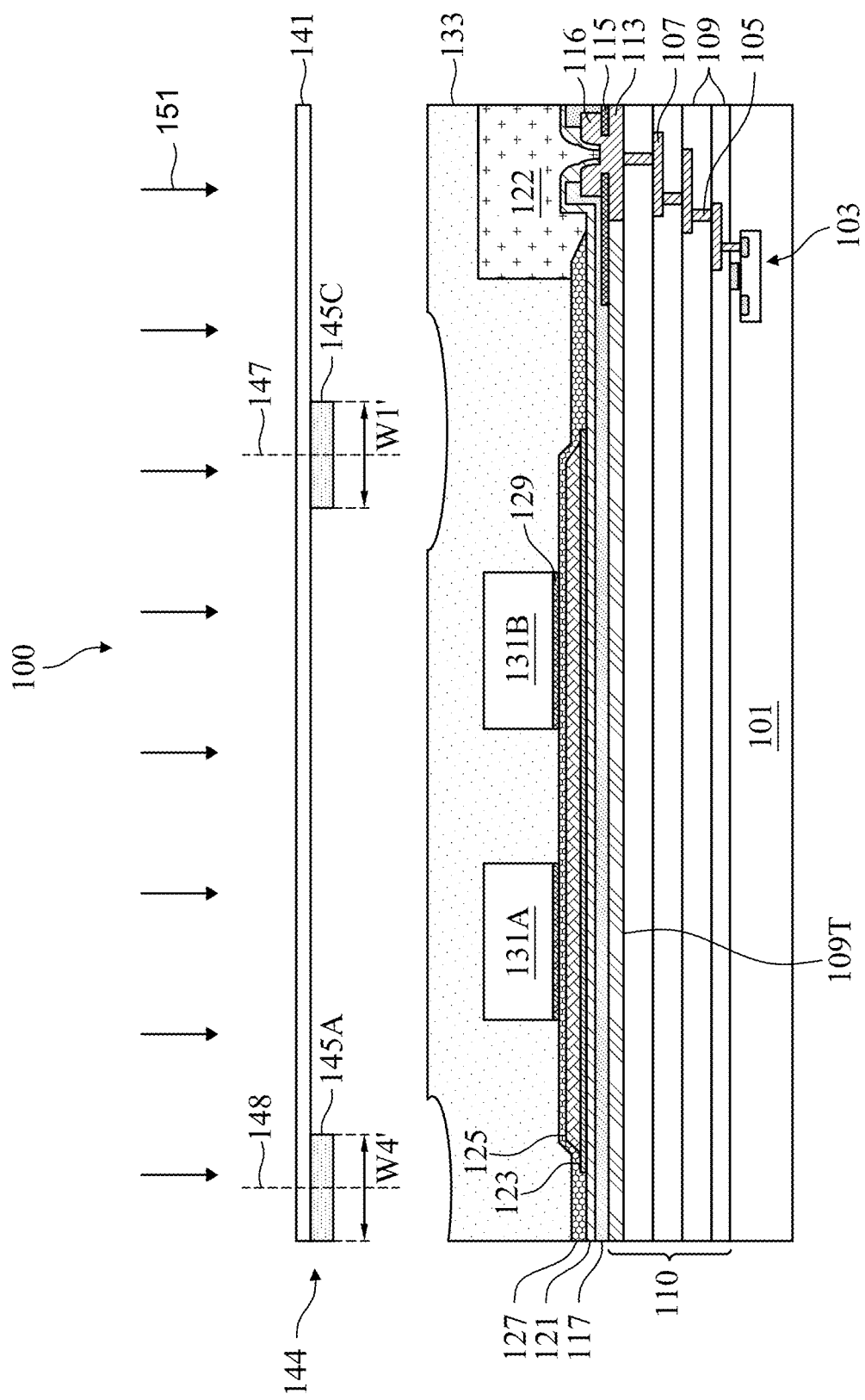

Next, in FIG. 5, the polymer layer 133 is exposed again. In particular, the light source 151 is projected onto the polymer layer 133 through a mask layer 144, which includes a transparent layer 141 and non-transparent patterns 145A and 145C (may be collectively referred to as non-transparent patterns 145). The non-transparent pattern 145C corresponds to the non-transparent pattern 143C in FIG. 4, but with a width W1' that is about 40 μm to about 50 μm smaller than the width W1 of the non-transparent pattern 143C. In some embodiments, the center axis of the non-transparent pattern 145C is the same as the center axis 147 of the non-transparent pattern 143C. In other words, the non-transparent patterns 143C and 145C are at the same location (e.g., having the same center axis 147) but having different widths. Similarly, the non-transparent pattern 145A corresponds to the non-transparent pattern 143A in FIG. 4, but with a width W4' that is about 40 μm to about 50 μm smaller than the width W4 of the non-transparent pattern 143A. In some embodiments, the center axis of the non-transparent pattern 145A is the same as the center axis 148 of the non-transparent pattern 143A. Notably, unlike the mask layer 142, which has a non-transparent pattern 143B laterally between the conductive features 131, the mask layer 144 does not have a non-transparent pattern laterally between the conductive features 131. The exposure energy of the exposure process in FIG. 5 may be similar to that in FIG. 4, and may be adjusted to achieve a target profile for the polymer layer 133 (see FIG. 6) after the developing process discussed hereinafter. The processing of FIG. 5 may also be referred to as a second exposure process for the polymer layer 133.

Next, in FIG. 6, the polymer layer 133 is developed using a developer (e.g., a chemical). In some embodiments, the polymer layer 133 is a negative photosensitive material, such that unexposed portions are soluble to the developer. FIG. 6 illustrates an example cross-section of the polymer layer 133 after the developing process. As illustrated in FIG. 6, different portions of the polymer layer 133 with different sizes are removed at different locations, due to, e.g., the different portions of the polymer layer 133 being exposed for different durations. In some embodiments, the locations and the dimensions (e.g., widths) of the non-transparent patterns 143/145 of the mask layers 142/144, as well as the exposure time/energy, among other process parameters, are adjusted to achieve a target profile for the polymer layer 133.

After the developing process of FIG. 6, the patterned polymer layer 133 may be cured at a temperature between about 300° C. and 330° C. for a duration between about 50 minutes and about 1 hour, as an example. Note that in the embodiment disclosed herein, no developing process is performed between the first exposure process and the second exposure process, and the polymer layer 133 is developed after the second exposure process. The photolithography process for the polymer layer 133, as illustrated in FIGS. 4-6, is also referred to as a double exposure process, which is different from a method of double photolithography, where a first exposure process is followed by a first developing process, then followed by a second exposure process and a subsequent second developing process.

In the example of FIG. 6, a first sidewall of the polymer layer 133, which is at the left side of the conductive feature 131A, has a kink profile. For example, the first sidewall of the polymer layer 133 has multiple segments (e.g., defined by points A, B, D, and C in FIG. 6) that intersect at various angles. Each segment of the first sidewall has a substantially linear profile, in some embodiments. In FIG. 6, the multiple segments of the first sidewall include: a first segment (e.g., between point A and point B, referred to as first segment AB) that intersects (e.g. connects with) a first upper surface 133UA of the polymer layer 133 at point A, a third segment (e.g., between point C and point D, referred to as third segment CD) that intersects the lower surface of the polymer layer 133 facing the substrate 101 at point C, and a second segment (e.g., between point B and point D, referred to as second segment BD) that intersects the first segment and the third segment at point B and point D, respectively. In the example of FIG. 6, an extension of the first segment AB (e.g., a line crossing points A and B) intersects internal regions of the polymer layer 133, and an extension of the second segment BD (e.g., a line crossing points B and D) intersects internal regions of the polymer layer 133. Therefore, the first sidewall of the polymer layer 133 comprising the multiple segments may also be referred to as having a concave shape.

In some embodiments, a second sidewall of the polymer layer 133, which is at the right side of the conductive feature 131B, has a same or similar kink profile as the first sidewall. In the example of FIG. 6, a third sidewall and a fourth sidewalls of the polymer layer 133, which are sidewalls between the conductive features 131A and 131B, have linear profiles (e.g., slanted linear sidewalls). In particular, the third sidewall and the fourth sidewall of the polymer layer 133 extend from the first upper surface 133UA (which is directly over the conductive feature 131) to a second upper surface 133UB (which is between the conductive features 131 and closer to the substrate 101 than the first upper surface 133UA). A distance between the third sidewall and the fourth sidewall of the polymer layer 133 decreases as the third sidewall and fourth sidewall extend toward the substrate 101. Due to the upper surface of the conductive features 131 being flat, the first upper surface 133UA of the polymer layer 133 is also flat. As a result, the thickness of the portion of the polymer layer 133 disposed directly over the conductive features 131 is uniform, which allows for easy control of the inductance (e.g., $L_{11}$ and $L_{22}$) of the conductive features 131.

In the embodiment of FIG. 6, a distance (e.g., a vertical distance) between the point A and the upper surface of the conductive feature 131A is denoted as distance $D_A$, a distance (e.g., a horizontal distance) between the point B and a closest sidewall (e.g., the left sidewall in FIG. 6) of the conductive feature 131A is denoted as distance $D_B$, and a distance (e.g., a horizontal distance) between the point C and the closest sidewall of the conductive feature 131A is denoted as distance $D_C$. In addition, an angle between the first segment AB and a horizontal line is denoted as angle $\theta_B$, an angle between the second segment BD and a horizontal line is denoted as angle $\theta_D$, and an angle between the third segment CD and a horizontal line is denoted as angle $\theta_C$. In some embodiments, the shape and dimensions of the polymer layer 133, such as the distances $D_A$, $D_B$, and $D_C$, and/or the angles $\theta_B$, $\theta_D$, and $\theta_C$, among other parameters, are controlled to be within pre-determined ranges such that electrical properties of the inductive component 150 are within design specifications.

For example, a ratio between the distance $D_A$ and a thickness T of the conductive feature 131 (e.g., $D_A$:T) is between about 1:4 and about 1:5, a ratio between the distance $D_B$ and the thickness T (e.g., $D_B$:T) is between about 1:2 and about 1:4, and a ratio between the distance $D_C$ and the thickness T (e.g., $D_C$:T) is between about 2:1 and about 4:1. The ratio $D_A$:T determines the inductance $L_{11}$ of the conductive features 131A, and the ratio $D_B$:T determines the inductance $L_{22}$ of the conductive features 131B. The above disclosed ranges help to ensure that the inductances (e.g., $L_{11}$ and $L_{22}$) of the conductive features 131 are within design specification (e.g., between about 6.3 nH and about 7.2 nH). If the ratios $D_A$:T, $D_B$:T, or $D_C$:T is outside the above disclosed ranges, the inductances $L_{11}$ and $L_{22}$ of the conductive features 131 may be out of the range of the design specification, and high inductance variations may occur. In addition, the inductor saturation current of the inductive component 150 formed may be negatively affected (e.g., reduced).

The disclosed ratio for $D_C$:T also helps to control the angle $\theta_C$, which influences the thickness of subsequently formed magnetic film 137, which in turn affects the step coverage of the magnetic film 137. The step coverage of the magnetic film 137 is calculated as the ratio between a first thickness of the magnetic film 137 along the first upper surface 133UA of the polymer layer 133 and a second thickness of the magnetic film 137 along the sidewalls of the polymer layer 133. A step coverage of the magnetic film 137 close to 1 may advantageously improve the inductor saturation current of the inductive component 150. The above disclosed ratios may help to ensure that the magnetic film 137 are formed to be a continuous layer that covers upper surfaces and sidewalls of the polymer layer 133 entirely (e.g., instead of being formed as discrete portions that expose the underlying insulation layer 135) and to have a substantially uniform thickness (e.g., step coverage close to 1, such as between 88% and 98%) for improved inductor saturation current.

In addition, or alternatively, the angle $\theta_D$ is formed to be smaller than the angle $\theta_B$ and the angle $\theta_C$ (e.g., $\theta_D < \theta_B$, and $\theta_D < \theta_C$). In some embodiments, the angle $\theta_B$ is smaller than about 50 degrees, the angle $\theta_C$ is smaller than about 60 degrees, and the angle $\theta_D$ is smaller than about 40 degrees. The disclosed ranges for the angles $\theta_B$, $\theta_C$, and $\theta_D$ help to ensure that the inductances $L_{11}$ and $L_{22}$ of the conductive features 131 are within the ranges of the design specification, and that large inductance variation and reduction of inductor saturation current are avoided.

In some embodiments, a center thickness $T_C$ of the conductive features 131 (measured at the center of the conductive features 131) is between about 15 μm and about 23 μm. The disclosed range of the center thickness $T_C$ help to control the DC resistance and the AC resistance of the device formed to be within a target range.

Figure 7A:
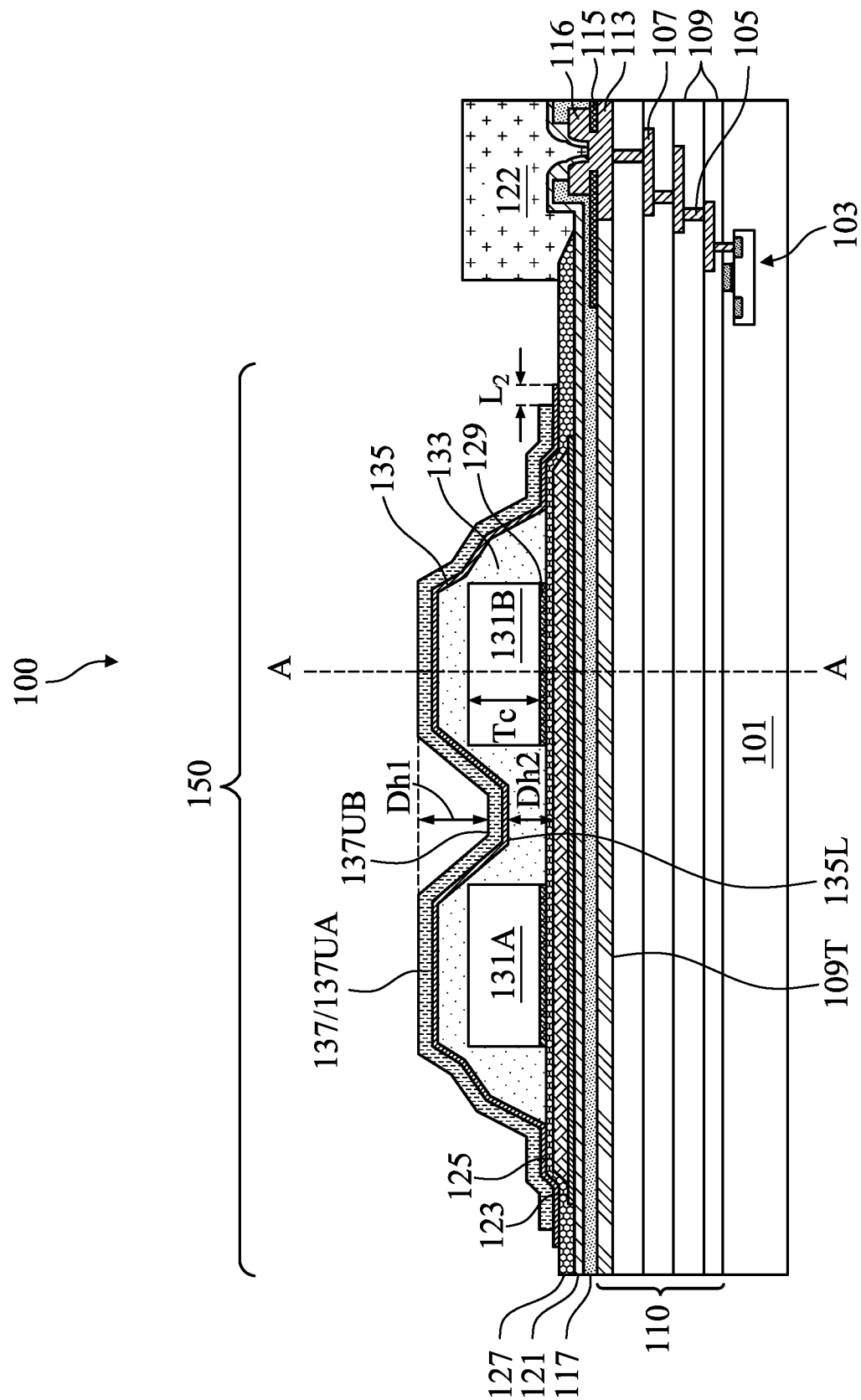

Next, in FIG. 7A, an insulation layer 135 and a magnetic film 137 are formed successively over the polymer layer 133 and the polymer layer 127. The insulation layer 135 and the magnetic film 137 may be formed of the same or similar materials as the insulation layer 123 and the magnetic film 125, respectively, thus details are not repeated. The insulation layer 135 and the magnetic film 137 are patterned to remove portions outside of the region of the inductive component 150. The remaining portions of the insulation layer 135 and the magnetic film 137, together with the conductive features 131A/131B, and the underlying insulation layer 123 and the underlying magnetic film 125, form the inductive component 150. In some embodiments, the insulation layer 135 functions as an etch stop layer for the magnetic film 137, such that the etching process used for patterning the magnetic film 137 does not damage the underlying layers/structures. As illustrated in FIG. 7A, the magnetic films 125 and 137 surround the conductive features 131, and form a closed magnetic loop when an electrical current is supplied to the conductive features 131.

In the example of FIG. 7A, sidewalls of the magnetic film 137 are recessed from respective sidewalls of the insulation layer 135, such that a lateral offset L2 (may also be referred to as a lateral distance) exists between a sidewall of the magnetic film 137 and a respective sidewall of the insulation layer 135. The lateral offset L2 may be in a range between about 1 μm and about 15 μm, as an example. In the illustrated embodiment, the insulation layer 135 also functions as a stress buffer for the magnetic film 137. During thermal processes, the magnetic film 137 may exert a tensile stress. The lateral offset $L_2$ reduces or prevents cracking of the underlying layers (e.g., 127) due to the stress of the magnetic film 137. Without the lateral offset L2 (e.g., when L2=0), stress from the magnetic film 137 may extend along the sidewall of the insulation layer 135 to the polymer layer 127 and may cause cracking in the polymer layer 127.

In some embodiments, the lateral offset $L_2$ is larger than the lateral offset $L_1$. In some embodiments, the insulation layer 135 is formed to be thicker than the insulation layer 123. In an example embodiment, the ratio between a thickness of the insulation layer 135 and a thickness of the insulation layer 123 is in a range between about 4:1 and about 10:1. The above disclosed ratio range and relation (e.g., $L_2 > L_1$) are chosen to reduce or prevent occurrence of cracking or wrinkle in the film scheme of the inductive component 150. Due to the film scheme (e.g., layout of the different layers and the material compositions of the different layers) of the inductive component 150, "full scheme bending" (e.g., bending of the full film scheme) effect poses great challenge for the device reliability during, e.g., thermal processes, or subsequent film deposition process. The above disclosed ratio range (e.g., between about 4:1 and about 10:1) and relationship (e.g., $L_2 > L_1$), along with other design parameters discussed herein, prevent or reduce the occurrence of cracking or wrinkle (e.g., bending) in the film scheme of the inductive component 150.

Still referring to FIG. 7A, a vertical distance between a first upper surface 137UA and a second upper surface 137UB of the magnetic film 137 is denoted as distance Dh1, where the first upper surface 137UA is directly over the conductive feature 131A, and the second upper surface 137UB is between the conductive features 131A and 131B. In addition, a vertical distance between an upper surface of the magnetic film 125 and a lower surface 135L of the insulation layer 135 is denoted as distance Dh2. In some embodiments, a ratio between the distance Dh1 and the distance Dh2 is between about 5/7 and about 2 (e.g., 5/7<Dh1:Dh2<2). The range of the ratio Dh1:Dh2 is chosen to ensure that a coupling factor K of the inductive component 150 is within a range (e.g., 6<K<7) given by the design specification. The coupling factor K is given by:

$$0 < K = \frac{M}{\sqrt{L_{11}L_{22}}} < 1$$

where $L_{11}$ and $L_{22}$ are the inductances of the conductive features 131A and 131B (e.g., coils), respectively, and M is the mutual inductance between the conductive features 131A and 131B.

In some embodiments, the ratio Dh1:Dh2 is adjusted to achieve a target value for the coupling factor K, while the sum of Dh1 and Dh2 remain unchanged. For example, increasing Dh2 increases the coupling factor K, and increasing Dh1 decreases the coupling factor K. The ratio Dh1:Dh2 may be adjusted by, e.g., modifying the size and location of the non-transparent pattern 143B (see FIG. 4) relative to the dimension (e.g., the distance W3 in FIG. 4) of the conductive features 131, the exposure time/energy, among other parameters. In an embodiment, the distance W3 between the conductive features 131 is designed to be between about 50 μm and about 60 μm to help achieve the disclosed range for the ratio of Dh1 and Dh2 (e.g., 5/7<Dh1:Dh2<2).

Figure 7B:
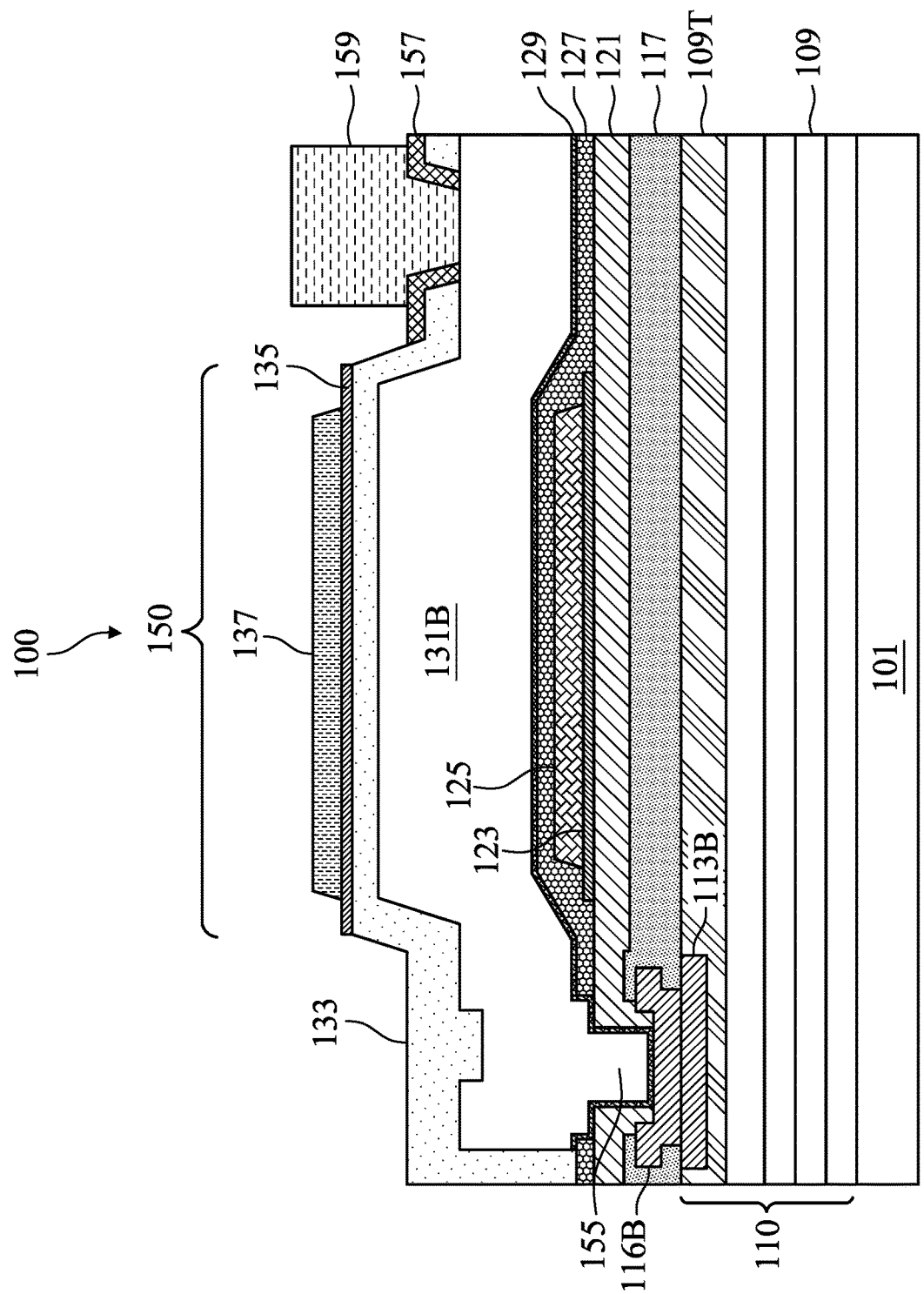
Figure 7C:
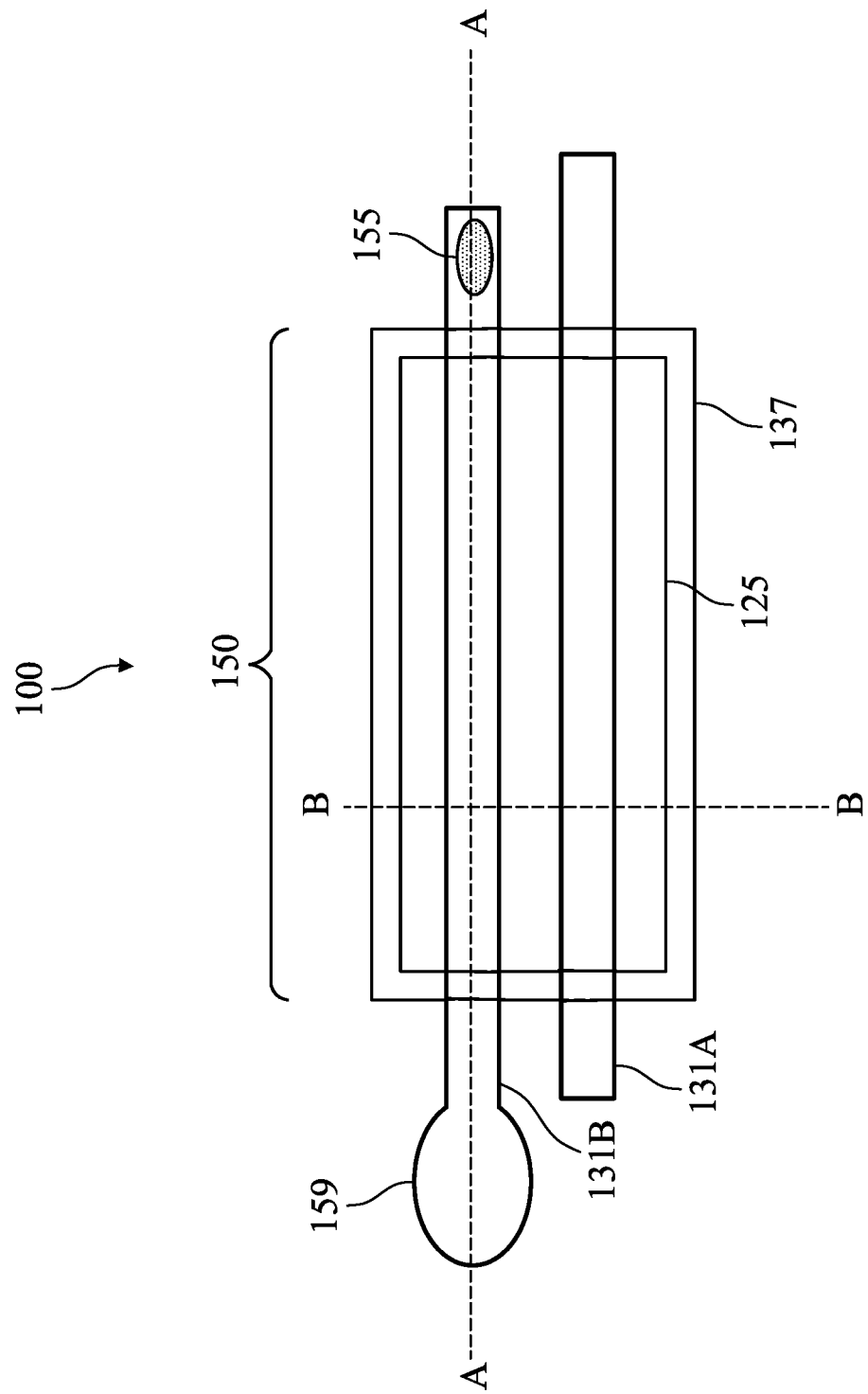

FIG. 7B illustrates a cross-sectional view of the semiconductor device 100 of FIG. 7A, but along cross-section A-A in FIG. 7A. FIG. 7C illustrates a plan view (e.g., when viewed from the top of the semiconductor device 100) of the semiconductor device 100. Note that for simplicity, not all features are illustrated in FIGS. 7B and 7C. FIG. 7A corresponds to the cross-sectional view along cross-section B-B in FIG. 7C.

As illustrated in FIGS. 7B and 7C, the conductive features 131A and 131B (e.g., conductive lines) extends beyond the region of the inductive component 150. Note that unlike a conventional inductive component, where a conductive feature (e.g., a coil) surrounds a magnetic material (e.g., a ferromagnetic core), the disclosed inductive component 150 includes conductive features (e.g., parallel conductive lines) surrounded by magnetic material (e.g., 125 and 137). FIG. 7B also illustrates a via 155 formed under the conductive feature 131B and electrically couples the conductive feature 131B to a conductive pad 116B (e.g., an aluminum pad) formed in the second passivation layer 117, which conductive pad 116B is coupled to a conductive feature 113B (e.g., a conductive line) in the top dielectric layer 109T of the interconnect structure 110. The conductive features 113B is electrically coupled to other conductive features of the interconnect structure 110. FIG. 7B further illustrates a conductive bump 159 (e.g., a copper bump, a copper pillar) formed over the conductive feature 131B, which conductive bump 159 extends through a passivation layer 157 to connect with the conductive feature 131B. The conductive bump 159 and the via 155 provide electrical connection to the conductive feature 131B. The conductive feature 131A may be electrically coupled to other conductive features similarly (e.g., through vias or conductive bumps), details are not repeated.

Figure 8:
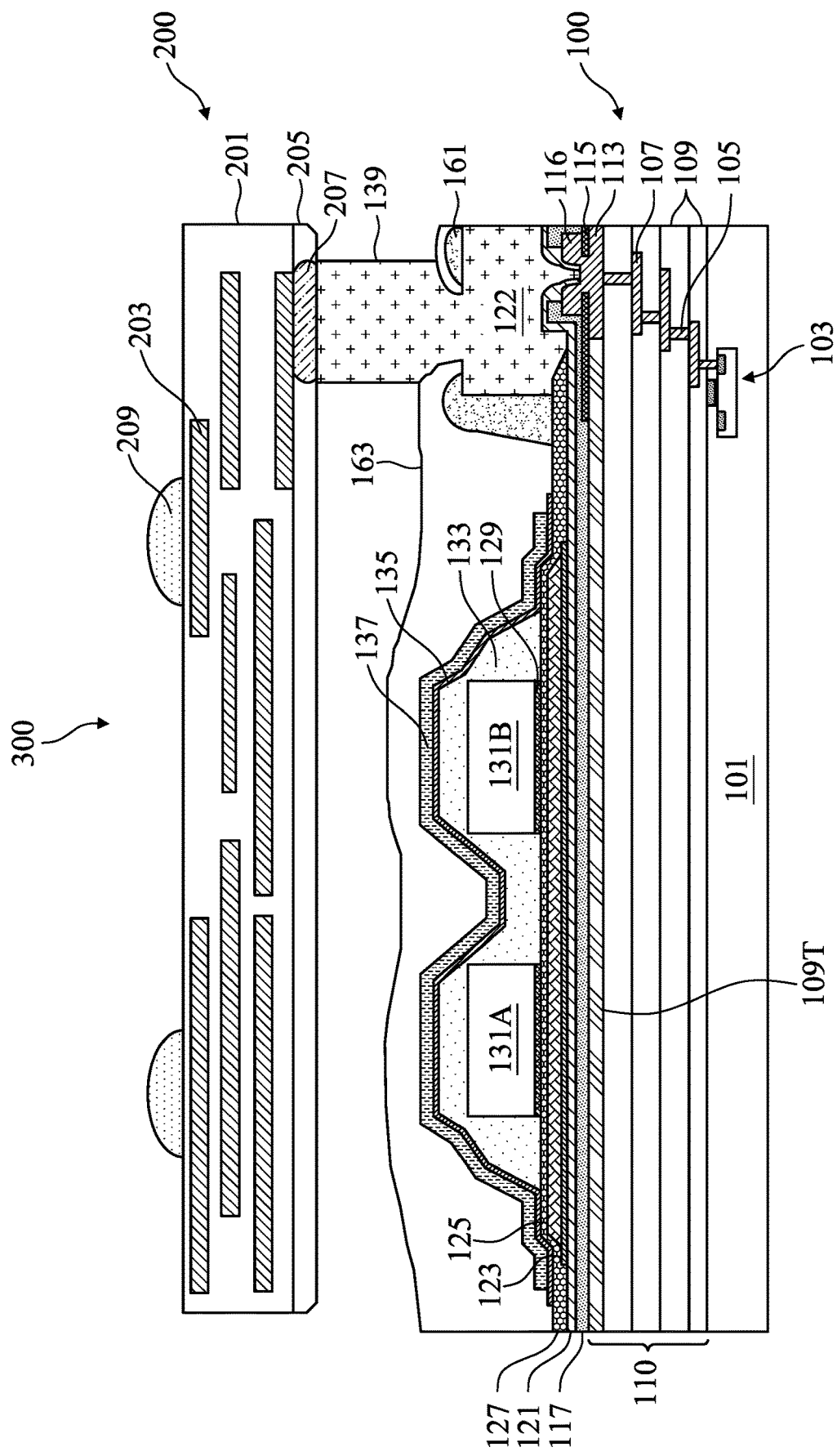
FIG. 8 illustrates a cross-sectional view of a semiconductor structure, in accordance with an embodiment.

FIG. 8 illustrates a cross-sectional view of a semiconductor structure 300, in accordance with an embodiment. The semiconductor structure 300 is formed by bonding the semiconductor device 100 of FIG. 7A to a substrate 200. In some embodiments, to form the semiconductor structure 300, a conductive connector 139 (e.g., a copper pillar) is formed on the PPI structure 122 of the semiconductor device 100, and is bonded to a conductive pattern (e.g., a copper pad) of the substrate 200 through a solder region 207. The substrate 200 may be, e.g., a printed circuit board, an interposer, or the like. The substrate 200 includes dielectric layers 201 and conductive features 203 (e.g., conductive lines, vias, conductive pads) formed in the dielectric layers 201. A passivation layer 205, e.g., a solder resist layer, or a polymer layer, is formed on a lower surface of the substrate 200, and conductive connectors 209 (e.g., solder balls) are formed on an upper surface of the substrate 200. FIG. 8 further illustrates a passivation layer 161 (e.g., a polymer layer) formed along sidewalls and the upper surface of the PPI structure 122, and a molding material 163 on the semiconductor device 100 around the conductive connector 139.

Figure 9:
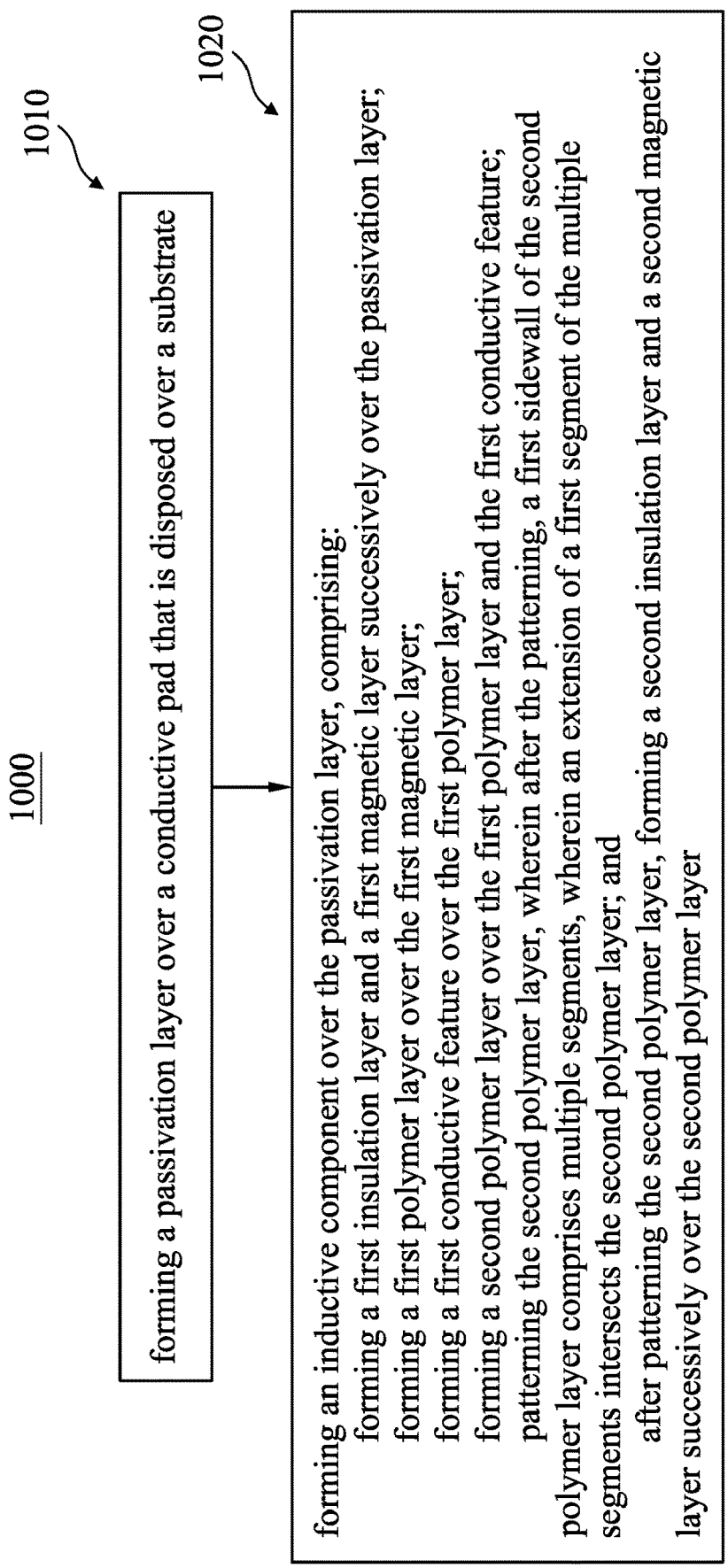
FIG. 9 illustrates flow chart of a method of forming a semiconductor device, in accordance with an embodiment.

FIG. 9 illustrates flow chart of a method 1000 of forming a semiconductor device, in accordance with an embodiment. It should be understood that the embodiment method shown in FIG. 9 is merely an example of many possible embodiment methods. One of ordinary skill in the art would recognize many variations, alternatives, and modifications. For example, various steps as illustrated in FIG. 9 may be added, removed, replaced, rearranged, or repeated.

Referring to FIG. 9, at block 1010, a passivation layer is formed over a conductive pad that is disposed over a substrate. At block 1020, an inductive component is formed over the passivation layer, comprising: forming a first insulation layer and a first magnetic layer successively over the passivation layer; forming a first polymer layer over the first magnetic layer; forming a first conductive feature over the first polymer layer; forming a second polymer layer over the first polymer layer and the first conductive feature; patterning the second polymer layer, wherein after the patterning, a first sidewall of the second polymer layer comprises multiple segments, wherein an extension of a first segment of the multiple segments intersects the second polymer layer; and after patterning the second polymer layer, forming a second insulation layer and a second magnetic layer successively over the second polymer layer.

Embodiments may achieve advantages. For example, the disclosed photolithography method, which includes double exposure of the polymer layer 133 followed by a developing process, allows the shape and dimensions of the patterned polymer layer 133 to be accurately controlled. This allows the electrical properties (e.g., inductances, coupling factor K, AD/DC resistance, inductor saturation current) of the inductive component formed to be tuned to achieve a target range, and to avoid high inductance variation and reduced inductor saturation current. In addition, other design factors, such as angles $Z_1$ and $Z_2$, lateral offset $L_1$ and $L_2$, and the thicknesses of the insulation layers 123 and 135, are tuned to improve the physical properties of the semiconductor device, and as a result, reliability issues such as electrical short of PPI structure, cracking of polymer layer, are avoided or reduced.

In accordance with an embodiment, a method of forming a semiconductor device includes: forming a passivation layer over a conductive pad disposed over a substrate; forming a first insulation layer and a first magnetic layer successively over the passivation layer; forming a first polymer layer over the first magnetic layer; forming a first conductive feature and a second conductive feature over the first polymer layer; forming a second polymer layer over the first polymer layer, the first conductive feature, and the second conductive feature, wherein the second polymer layer is formed of a photosensitive material; exposing the second polymer layer to a light source projected through a first mask layer, wherein the first mask layer is positioned over the second polymer layer during the exposing and comprises: a first transparent layer; a first non-transparent pattern attached to the first transparent layer and at a first side of the first conductive feature; and a second non-transparent pattern attached to the first transparent layer and at a second opposing side of the first conductive feature between the first conductive feature and the second conductive feature; exposing the second polymer layer to the light source projected through a second mask layer, wherein the second mask layer comprises a third non-transparent pattern attached to a second transparent layer and at the first side of the first conductive feature, the third non-transparent pattern having a smaller width than the first non-transparent pattern, wherein the second mask layer is free of a non-transparent pattern between the first conductive feature and the second conductive feature; developing the second polymer layer to remove portions of the second polymer layer; and after the developing, forming a second insulation layer and a second magnetic layer successively over the second polymer layer. In an embodiment, the first magnetic layer and the second magnetic layer are formed of a magnetic compound material. In an embodiment, after the developing, a first sidewall of the second polymer layer adjacent to the first side of the first conductive feature has a concave shape. In an embodiment, after the developing, a first sidewall of the second polymer layer adjacent to the first side of the first conductive feature has multiple segments that intersect at a plurality of different angles. In an embodiment, the method further comprises adjusting a profile of the first sidewall of the second polymer layer by adjusting locations and sizes of the first non-transparent pattern and the second non-transparent pattern. In an embodiment, after the developing, a second sidewall of the second polymer layer has a slanted linear profile, wherein the first sidewall and the second sidewall of the second polymer layer are on opposing sides of the first conductive feature, and the second sidewall of the second polymer layer is between the first conductive feature and the second conductive feature. In an embodiment, the first sidewall of the second polymer layer contacts the first polymer layer, wherein the second sidewall of the second polymer layer is spaced apart from the first polymer layer. In an embodiment, forming the first polymer layer comprises: depositing the first polymer layer over the passivation layer, wherein the first polymer layer is formed of another photosensitive material; and patterning the first polymer layer using a photolithography process, wherein patterning the first polymer layer comprises adjusting an energy of the photolithography process or a focus of the photolithography process such that a first sidewall of the first polymer layer forms a first angle with a first direction perpendicular to a major upper surface of the substrate, wherein the first angle is between about 15 degrees and about 75 degrees. In an embodiment, the method further comprises forming a post passivation interconnect (PPI) structure over and electrically coupled to the conductive pad, wherein a portion of the first polymer layer underlies the PPI structure, wherein the PPI structure extends along an upper surface of the first polymer layer and the first sidewall of the first polymer layer. In an embodiment, forming the second magnetic layer comprises: forming the second magnetic layer over the second insulation layer; and removing end portions of the second magnetic layer proximate to sidewalls of the second insulation layer such that sidewalls of the second magnetic layer are recessed from respective sidewalls of the second insulation layer. In an embodiment, forming the first magnetic layer comprises: recessing sidewalls of the first magnetic layer from respective sidewalls of the first insulation layer; and shaping a sidewall profile of the first magnetic layer by performing a wet etch process, wherein after the wet etch process, the sidewalls of the first magnetic layer are slanted with respect to a first direction perpendicular to a major upper surface of the substrate. In an embodiment, the second insulation layer are formed to be thicker than the first insulation layer.

In accordance with an embodiment, a method of forming a semiconductor device includes: forming a passivation layer over a conductive pad that is disposed over a substrate; and forming an inductive component over the passivation layer, comprising: forming a first insulation layer and a first magnetic layer successively over the passivation layer; forming a first polymer layer over the first magnetic layer; forming a first conductive feature over the first polymer layer; forming a second polymer layer over the first polymer layer and the first conductive feature; patterning the second polymer layer, wherein after the patterning, a first sidewall of the second polymer layer comprises multiple segments, wherein an extension of a first segment of the multiple segments intersects the second polymer layer; and after patterning the second polymer layer, forming a second insulation layer and a second magnetic layer successively over the second polymer layer. In an embodiment, the second polymer layer is formed of a photosensitive polymer material, wherein patterning the second polymer layer comprises: positioning a first mask layer over the second polymer layer, wherein the first mask layer comprises non-transparent patterns attached to a first transparent layer, wherein the non-transparent patterns comprise a first non-transparent pattern disposed at a first side of the first conductive feature, and comprises a second non-transparent pattern disposed at a second opposing side of the first conductive feature; projecting a light source through the first mask layer to the second polymer layer; positioning a second mask layer over the second polymer layer, wherein the second mask layer comprises a third non-transparent pattern attached to a second transparent layer and disposed at the first side of the first conductive feature, wherein the third non-transparent patterns has a width smaller than that of the first non-transparent pattern; projecting the light source through the second mask layer to the second polymer layer; and developing the second polymer layer after projecting the light source through the first mask layer and through the second mask layer. In an embodiment, the first magnetic layer is formed to have a width smaller than that of the first insulation layer such that sidewalls of the first magnetic layer are recessed from respective sidewalls of the first insulation layer, wherein the second magnetic layer is formed to have a width smaller than that of second isolation layer such that sidewalls of the second magnetic layer are recessed from respective sidewalls of the second isolation layer. In an embodiment, the multiple segments of the first sidewall of the second polymer layer comprise: a first segment connected to an first upper surface of the second polymer layer facing away from the substrate, the first upper surface being an uppermost surface of the second polymer layer; a third segment connected to a lower surface of the second polymer layer facing the substrate; and a second segment connecting the first segment and the third segment, wherein the first segment intersects the first upper surface of the second polymer layer at a first location, wherein the first segment intersects the second segment at a second location, and the third segment intersects the lower surface of the second polymer layer at a third location, wherein the first location and an upper surface of the first conductive feature facing away from the substrate has a vertical distance $D_A$, wherein the second location and a first sidewall of the first conductive feature facing the second location has a lateral distance $D_B$, wherein the third location and the first sidewall of the first conductive feature has a lateral distance $D_C$, wherein the first conductive feature has a thickness T, wherein a ratio between $D_A$ and T is between 1:4 and 1:5, wherein a ratio between $D_B$ and T is between 1:2 and 1:4, wherein a ratio between $D_C$ and T is between 2:1 and 4:1. In an embodiment, a second sidewall of the second polymer layer opposing the first sidewall of the second polymer layer extends from the first upper surface of the second polymer layer to a second upper surface of the second polymer layer, the second upper surface being closer to the substrate than the first upper surface of the second polymer layer, wherein the first upper surface and the second upper surface of the second polymer layer have a vertical distance Dh1, wherein an upper surface of the first magnetic layer and a lower surface of the second insulation layer has a vertical distance Dh2, wherein a ratio between Dh1 and Dh2 is between 5/7 and 2.

In accordance with an embodiment, a semiconductor device includes: a conductive pad over a substrate; a passivation layer over the conductive pad; a first insulation layer over the passivation layer; a first magnetic layer over the first insulation layer; a first polymer layer over the first magnetic layer; a conductive feature over the first polymer layer; a second polymer layer over the first polymer layer and around the conductive feature, wherein a first sidewall of the second polymer layer has multiple segments that intersect at different angles; a second insulation layer over the second polymer layer; and a second magnetic layer over the second insulation layer. In an embodiment, the first sidewall of the second polymer layer has a concave shape. In an embodiment, the second insulation layer is thicker than the first insulation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a passivation layer over a conductive pad disposed over a substrate;
    forming a first insulation layer and a first magnetic film successively over the passivation layer;
    forming a first polymer layer over the first magnetic film;
    forming a first conductive feature and a second conductive feature over the first polymer layer;
    forming a second polymer layer over the first polymer layer, the first conductive feature, and the second conductive feature, wherein the second polymer layer is formed of a photosensitive material;
    exposing the second polymer layer to a light source projected through a first mask layer, wherein the first mask layer is positioned over the second polymer layer during the exposing and comprises:
        a first transparent layer;
        a first non-transparent pattern attached to the first transparent layer and at a first side of the first conductive feature; and
        a second non-transparent pattern attached to the first transparent layer and at a second opposing side of the first conductive feature between the first conductive feature and the second conductive feature;
    exposing the second polymer layer to the light source projected through a second mask layer, wherein the second mask layer comprises a third non-transparent pattern attached to a second transparent layer and at the first side of the first conductive feature, the third non-transparent pattern having a smaller width than the first non-transparent pattern, wherein the second mask layer is free of a non-transparent pattern between the first conductive feature and the second conductive feature;
    developing the second polymer layer to remove portions of the second polymer layer; and
    after the developing, forming a second insulation layer and a second magnetic film successively over the second polymer layer.

2. The method of claim 1, wherein the first magnetic film and the second magnetic film are formed of a compound magnetic material.

3. The method of claim 1, wherein after the developing, a first sidewall of the second polymer layer adjacent to the first side of the first conductive feature has a concave shape.

4. The method of claim 1, wherein after the developing, a first sidewall of the second polymer layer adjacent to the first side of the first conductive feature has multiple segments that intersect at a plurality of different angles.

5. The method of claim 4, further comprising adjusting a profile of the first sidewall of the second polymer layer by adjusting locations and sizes of the first non-transparent pattern and the second non-transparent pattern.

6. The method of claim 4, wherein after the developing, a second sidewall of the second polymer layer has a slanted linear profile, wherein the first sidewall and the second sidewall of the second polymer layer are on opposing sides of the first conductive feature, and the second sidewall of the second polymer layer is between the first conductive feature and the second conductive feature.

7. The method of claim 6, wherein the first sidewall of the second polymer layer contacts the first polymer layer, wherein the second sidewall of the second polymer layer is spaced apart from the first polymer layer.

8. The method of claim 1, wherein the forming the first polymer layer comprises:
    depositing the first polymer layer over the passivation layer, wherein the first polymer layer is formed of another photosensitive material; and
    patterning the first polymer layer using a photolithography process, wherein the patterning the first polymer layer comprises adjusting an energy of the photolithography process or a focus of the photolithography process such that a first sidewall of the first polymer layer forms a first angle with a first direction perpendicular to a major upper surface of the substrate, wherein the first angle is between about 15 degrees and about 75 degrees.

9. The method of claim 8, further comprising forming a post passivation interconnect (PPI) structure over and electrically coupled to the conductive pad, wherein a portion of the first polymer layer underlies the PPI structure, wherein the PPI structure extends along an upper surface of the first polymer layer and the first sidewall of the first polymer layer.

10. The method of claim 1, wherein the forming the second magnetic film comprises:
    forming the second magnetic film over the second insulation layer; and
    removing end portions of the second magnetic film proximate to sidewalls of the second insulation layer such that sidewalls of the second magnetic film are recessed from respective sidewalls of the second insulation layer.

11. The method of claim 1, wherein the forming the first magnetic film comprises:
recessing sidewalls of the first magnetic film from respective sidewalls of the first insulation layer; and
shaping a sidewall profile of the first magnetic film by performing a wet etch process, wherein after the wet etch process, the sidewalls of the first magnetic film are slanted with respect to a first direction perpendicular to a major upper surface of the substrate.

12. The method of claim 1, wherein the second insulation layer is formed to be thicker than the first insulation layer.

13. A method of forming a semiconductor device, the method comprising:
forming a passivation layer over a conductive pad, wherein the conductive pad is disposed over a substrate; and
forming an inductive component over the passivation layer, comprising:
forming a first insulation layer and a first magnetic film successively over the passivation layer;
forming a first polymer layer over the first magnetic film;
forming a first conductive feature over the first polymer layer;
forming a second polymer layer over the first polymer layer and the first conductive feature;
patterning the second polymer layer, wherein after the patterning, a first sidewall of the second polymer layer comprises multiple segments, wherein a line extending along a first segment of the multiple segments intersects the second polymer layer; and
after the patterning the second polymer layer, forming a second insulation layer and a second magnetic film successively over the second polymer layer.

14. The method of claim 13, wherein the second polymer layer is formed of a photosensitive polymer material, wherein the patterning the second polymer layer comprises:
positioning a first mask layer over the second polymer layer, wherein the first mask layer comprises non-transparent patterns attached to a first transparent layer, wherein the non-transparent patterns comprise a first non-transparent pattern disposed at a first side of the first conductive feature, and comprise a second non-transparent pattern disposed at a second opposing side of the first conductive feature;
projecting a light source through the first mask layer to the second polymer layer;
positioning a second mask layer over the second polymer layer, wherein the second mask layer comprises a third non-transparent pattern attached to a second transparent layer and disposed at the first side of the first conductive feature, wherein the third non-transparent pattern has a width smaller than that of the first non-transparent pattern;
projecting the light source through the second mask layer to the second polymer layer; and
developing the second polymer layer after projecting the light source through the first mask layer and through the second mask layer.

15. The method of claim 13, wherein the first magnetic film is formed to have a width smaller than that of the first insulation layer such that sidewalls of the first magnetic film are recessed from respective sidewalls of the first insulation layer, and wherein the second magnetic film is formed to have a width smaller than that of the second insulation layer such that sidewalls of the second magnetic film are recessed from respective sidewalls of the second insulation layer.

16. The method of claim 13, wherein the multiple segments of the first sidewall of the second polymer layer comprise:
a first segment connected to a first upper surface of the second polymer layer facing away from the substrate, the first upper surface being an uppermost surface of the second polymer layer;
a third segment connected to a lower surface of the second polymer layer facing the substrate; and
a second segment connecting the first segment and the third segment, wherein the first segment intersects the first upper surface of the second polymer layer at a first location, wherein the first segment intersects the second segment at a second location, and the third segment intersects the lower surface of the second polymer layer at a third location, wherein the first location and an upper surface of the first conductive feature facing away from the substrate have a vertical distance $D_A$ in-between, wherein the second location and a first sidewall of the first conductive feature facing the second location have a lateral distance $D_B$ in-between, wherein the third location and the first sidewall of the first conductive feature have a lateral distance $D_C$ in-between, wherein the first conductive feature has a thickness T, wherein a ratio between $D_A$ and T is between 1:4 and 1:5, wherein a ratio between $D_B$ and T is between 1:2 and 1:4, and wherein a ratio between $D_C$ and T is between 2:1 and 4:1.

17. The method of claim 16, wherein a second sidewall of the second polymer layer opposing the first sidewall of the second polymer layer extends from the first upper surface of the second polymer layer to a second upper surface of the second polymer layer, the second upper surface being closer to the substrate than the first upper surface of the second polymer layer, wherein the first upper surface and the second upper surface of the second polymer layer have a vertical distance Dh1 in-between, wherein an upper surface of the first magnetic film and a lower surface of the second insulation layer has a vertical distance Dh2 in-between, and wherein a ratio between Dh1 and Dh2 is between 5/7 and 2.

18. A semiconductor device comprising:
a conductive pad over a substrate;
a passivation layer over the conductive pad;
a first insulation layer over the passivation layer;
a first magnetic film over the first insulation layer;
a first polymer layer over the first magnetic film;
a conductive feature over the first polymer layer;
a second polymer layer over the first polymer layer and around the conductive feature, wherein a first sidewall of the second polymer layer has multiple segments that intersect at different angles;
a second insulation layer over the second polymer layer; and
a second magnetic film over the second insulation layer.

19. The semiconductor device of claim 18, wherein the first sidewall of the second polymer layer has a concave shape.

20. The semiconductor device of claim 18, wherein the second insulation layer is thicker than the first insulation layer.

* * * * *